United States Patent
Shaw

[19]

[11] Patent Number: 6,107,880
[45] Date of Patent: Aug. 22, 2000

[54] METHOD AND APPARATUS FOR INCREASING THE LINEARITY OF THE PHASE AND GAIN OF A POWER AMPLIFIER CIRCUIT

[75] Inventor: Michael Joseph Shaw, Keller, Tex.

[73] Assignee: Motorola, Inc., Schaumburg, Ill.

[21] Appl. No.: 09/129,927

[22] Filed: Aug. 6, 1998

[51] Int. Cl.[7] .................................................. H03G 3/20
[52] U.S. Cl. .......................................... 330/136; 330/129
[58] Field of Search ................................... 330/136, 149, 330/127, 129

[56] References Cited

U.S. PATENT DOCUMENTS

| | | | |
|---|---|---|---|
| 4,873,493 | 10/1989 | Fujiwara | 330/136 |
| 5,142,240 | 8/1992 | Isota et al. | 330/136 |
| 5,311,143 | 5/1994 | Soliday | 330/136 |
| 5,420,536 | 5/1995 | Faulkner et al. | 330/136 |
| 5,831,475 | 11/1998 | Myers et al. | 330/136 |
| 5,861,777 | 1/1999 | Sigmon et al. | 330/136 |

FOREIGN PATENT DOCUMENTS

| | | | |
|---|---|---|---|
| 000562961 | 9/1993 | European Pat. Off. | 330/136 |
| 1568513 | 5/1980 | United Kingdom | 330/136 |

*Primary Examiner*—Robert Pascal
*Assistant Examiner*—Khanh Van Nguyen
*Attorney, Agent, or Firm*—Richard A. Sonnentag; Mario J. Donato, Jr.

[57] ABSTRACT

The present invention provides for a method and apparatus for increasing the linearity of the phase and gain of an amplifier circuit (10, 22). The amplifier circuit (10, 22) maintains linearity of the amplified output signal by monitoring the power levels of the input signal, and adjusting the supply voltage level(s) of the amplifier (18), based upon the measured input power levels. By appropriately adjusting the supply voltage level(s) of the amplifier (18) an output signal having a consistent gain and phase can be realized. Preferably a delay circuit (26) will be used to delay receipt of the input signal by the amplifier (18), so as to synchronize receipt of the input signal with the corresponding source voltage adjustments. The value of the delay preferably corresponds to the time for the envelope detector (14) to measure the instantaneous input power levels and the time for the processing unit (16) to determine and apply the appropriate supply voltage level(s) to the amplifier (18).

13 Claims, 1 Drawing Sheet

METHOD AND APPARATUS FOR INCREASING THE LINEARITY OF THE PHASE AND GAIN OF A POWER AMPLIFIER CIRCUIT

FIELD OF THE INVENTION

The present invention relates generally to power amplifier circuits, and more specifically to increasing the linearity of the phase and gain of a power amplifier circuit by varying the supply voltage levels.

BACKGROUND OF THE INVENTION

Amplifiers are devices, which ideally increase the strength of an input signal without appreciably altering the input signal's other signal characteristics. However amplifiers often perform in a manner which is less than ideal. Amplifiers often introduce some distortion of amplitude and phase into the amplified output signal. This is because amplifiers typically contain circuit elements having inherent non-linear characteristics.

In order to reduce unwanted distortions and increase linearity, previous amplifier circuits have made use of linearization techniques, including a linearization technique called feed forward. One such example of a feed forward linearization technique, provides for an input signal which is sampled prior to amplification. A pilot signal is then added to the input signal forming a combined signal. The combined signal is then amplified, which introduces the inherent non-linearities of the amplifier into an amplified combined signal. The sampled input signal is then subtracted from the amplified combined signal to determine the distortion in the sampled amplified signal and an error signal is produced.

The error signal is then adjusted in amplitude and phase, based on the level of the pilot signal detected at the circuit output. The adjusted error signal is then amplified and subtracted from the combined amplified signal to create a circuit output signal having less linear distortion.

In essence the feed forward technique allows the distortion to be introduced into the amplified signal. The magnitude of the distortion is then determined by monitoring the portion of the amplified signal corresponding to the pilot signal. The distortion is then fed back and is subtracted from the amplified signal to cancel itself out. In this way amplifier circuits having reduced linear distortion have been produced.

However, the feed forward technique requires several additional circuit elements including circuitry for producing a pilot signal, circuitry for measuring the level of nonlinear distortion, and circuitry for removing both the distortion and the pilot signal from the amplified signal. Circuit elements that would not be necessary if the amplifier never initially produced the nonlinear distortion. Therefore a method and apparatus for increasing the linearity of the phase and gain of an amplifier circuit, such that the linear distortion in the amplified signal is not initially produced, would be beneficial.

DETAILED DESCRIPTION OF THE PREFERRED EMBODIMENT

The present invention provides for a method and apparatus for increasing the linearity of the phase and gain of an amplifier circuit. The amplifier circuit maintains linearity of the amplified output signal by monitoring the power levels of the input signal, and adjusting the supply voltage level(s) of the amplifier, based upon the measured input power levels.

Stated more specifically a method is provided for increasing the linearity of the phase and gain of an amplifier circuit. The method comprises the steps of receiving an input signal to be amplified, detecting the power level of the input signal, and determining a supply voltage level for maintaining the linearity of an amplified output signal, based upon the power level of the input signal. The method then adjusts the supply voltage of the amplifier to the determined supply voltage level at the same time the corresponding input signal is received at the input of the amplifier. The input signal is then amplified for producing a linear amplified output signal.

Furthermore an apparatus is provided for increasing the linearity of the phase and gain of an amplifier circuit. The apparatus comprises an input for receiving an input signal to be amplified, an envelope detector coupled to said input for detecting the power level of the input signal, and a processing unit coupled to said envelope detector for determining a supply voltage level, based upon the power level of the input signal. The apparatus further provides for an amplifier coupled to said processing unit and said input for receiving an input signal, and producing a linear amplified output signal, wherein said processing unit adjusts the supply voltage of said amplifier for maintaining the linearity of the amplified output signal. The apparatus further provides for an output for outputting said linear amplified output signal.

Figure 1:
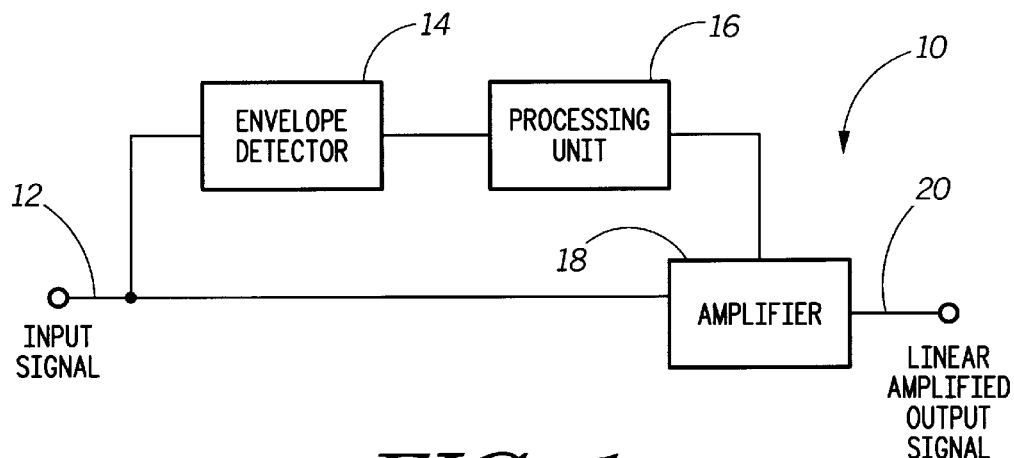
FIG. 1 is a block diagram generally depicting an amplifier circuit for increasing the linearity of the phase and gain by controlling the supply voltage variation, in accordance with the present invention.

Referring now to the drawings in greater detail, there is generally depicted in FIG. 1 a block diagram of an amplifier circuit 10 for increasing the linearity of the phase and gain by controlling the supply voltage variation, in accordance with the present invention. The circuit shown in FIG. 1 provides for an input 12 for receiving an input signal. The input signal is coupled to an envelope detector 14, wherein the power level of the input signal is detected. The envelope detector 14 is coupled to a processing unit 16, which receives a signal representing the power level of the input signal. The processing unit 16 adjusts the supply voltage levels of the amplifier 18, in response to the received power level of the input signal.

The amplifier 18 is coupled to the input 12 for receiving the input signal to be amplified. The amplifier 18 then produces an amplified output signal at an output 20, which is coupled to the amplifier 18.

Figure 2:
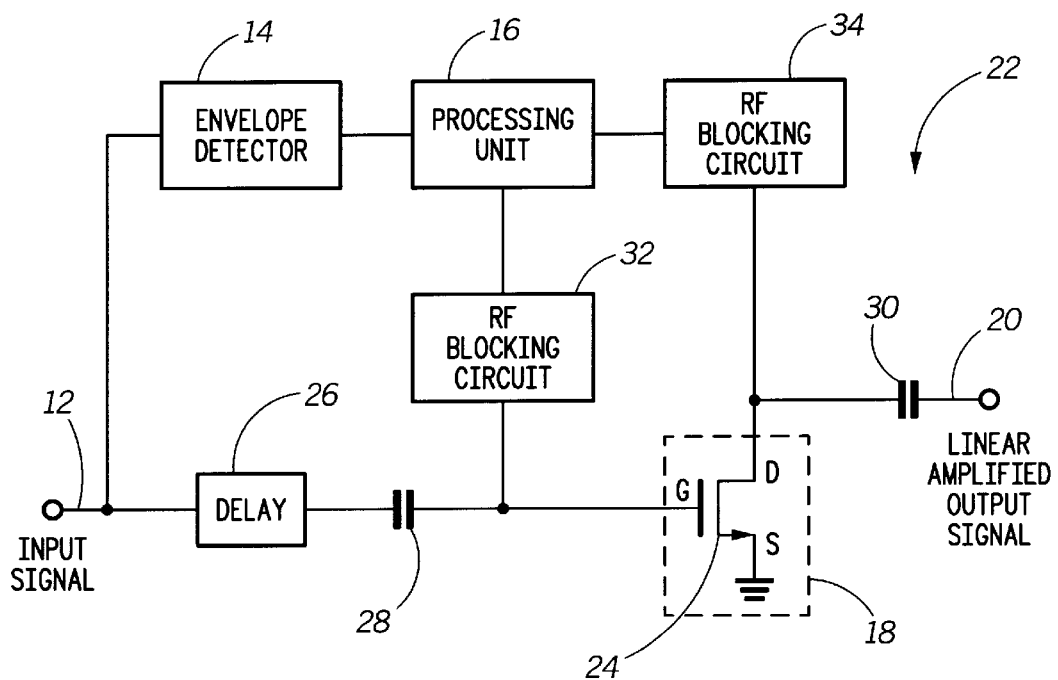
FIG. 2 is a more detailed block diagram of the amplifier circuit, shown in FIG. 1.

FIG. 2, is a more detailed block diagram of an amplifier circuit 22, which corresponds to the amplifier circuit 10 shown in FIG. 1. The amplifier circuit 22, similarly includes an input 12 for receiving an input signal. In the preferred embodiment the amplifier circuit 22 is a power amplifier for CDMA (Code Division Multiple Access) signals, and therefore the input signal is likely to have a frequency in the radio frequency spectrum.

The input 12 is coupled to the envelope detector 14, which measures the instantaneous power amplitude. The envelope detector 14 is coupled to the processing unit 16, which receives a value corresponding to the instantaneous power and generates an adjusted supply voltage level(s), which at the current input power levels will provide for consistent gain and phase. The supply voltage level(s) is coupled to the amplifier 18.

In the preferred embodiment the amplifier 18 is comprised of a laterally diffused metal oxide semiconductor transistor (LDMOS) 24. The LDMOS has a gate connection G, a drain connection D, and a source connection S. The source connection S is internally coupled to the semiconductor substrate, typically ground. The input 12 is coupled to the gate connection G of the LDMOS 24, via a delay circuit 26 and a first DC blocking capacitor 28.

The first DC blocking capacitor 28 allows the AC component of the input signal to pass to the gate connection G of the LDMOS 24. The delay circuit causes the input signal to appear at the gate connection G of the LDMOS 24 an amount of time equivalent to the delay value of the delay circuit 26, after the input signal would have normally appeared at the gate connection G. The delay circuit 26 is used to synchronize the input signal with a corresponding supply voltage level(s) determined to maintain a linear response in the LDMOS 24.

The drain connection D of the LDMOS 24 is coupled to the output 20 via a second DC blocking capacitor 30. Similar to the first DC blocking capacitor 28, the second DC blocking capacitor 30, allows only the AC portion of the amplified output signal to pass to the output 20.

In the preferred embodiment the processing unit 16 produces two supply voltages for the LDMOS 24. The processing unit 16 produces a gate bias voltage level, which is coupled to the gate connection G of the LDMOS 24, via a first RF blocking circuit 32. The processing unit 16 further produces a drain bias voltage level, which is coupled to the drain connection D of the LDMOS 24, via a second RF blocking circuit 34. Both RF blocking circuits 32 and 34 help to insure that the LDMOS 24 only receives a bias voltage level that does not contain radio frequency noise.

The instantaneous power level of the input signal, determined by the envelope detector 14, is used by the processing unit 16 to determine the magnitude of the adjustment needed in the supply voltage level(s) to maintain a linear response in the LDMOS 24.

The LDMOS 24 due in part to inherent non-linearities will amplify an input signal having different power levels a variable amount, affecting both phase and gain. At lower input power levels the variations tend to be smaller, at higher input power levels the differences tend to become more pronounced. This is due in part to the LDMOS 24 operating in or closer to saturation at higher power levels.

In order to compensate for the fluctuations in the phase and the gain, the supply voltage level(s) are adjusted, by the processing unit 16. It has been determined that the gain will generally increase and the phase will generally decrease as the gate bias voltage level is increased. Conversely gain will generally decrease and phase will generally increase as the gate bias voltage level is decreased. An increase in the drain bias voltage level will generally result in an increase in both gain and phase. Conversely, a decrease in the drain bias voltage level will generally result in a decrease in both gain and phase. Furthermore, changes in the gate bias voltage level tends to have a greater effect on phase than changes in the drain bias voltage level.

In the preferred embodiment, the supply voltage level(s) will be selected to hold the gain constant at around 10 db, and the phase constant at around minus 105°.

The supply voltage level(s), adjusted by the processing unit 16 for maintaining a linear response, could be determined in one of at least a couple of ways, including the values being previously experimentally determined, stored and indexed within a data structure, based on the input power level of the input signal measured, or they could be computed by a determined formula.

In any event, regardless of the method used, there will likely be a delay between the time the processing unit 16 receives the power level of the input signal and the time the processing unit 16 determines the appropriate supply voltage level(s). Consequently the preferred embodiment makes use of a delay circuit 26 in the signal path of the input signal prior to being received by the amplifier 18.

The delay produced by the delay circuit 26 allows the envelope detector 14 and the processing unit 16 to determine and adjust the necessary supply voltage level(s) so as to be ready when the corresponding portion of the input signal arrives at the input of the amplifier 18. The value of the delay preferably corresponds to the time for the envelope detector to measure the instantaneous input power levels and the time for the processing unit to determine and apply the appropriate supply voltages to the amplifier.

From the foregoing description, it will be apparent that the gain control circuit and method for providing gain control of a variable amplifier using a pilot signal of the present invention has a number of advantages, some of which have been described above and others of which are inherent in the invention. Also it will be understood that modifications can be made to the circuit and method described above without departing from the teachings of the invention.

I claim:

1. A method for increasing the linearity of the phase and gain of an amplifier circuit comprising the steps of:

receiving an input signal to be amplified;

detecting the power level of the input signal;

determining a supply voltage level for maintaining the linearity of an amplified output signal, based upon the power level of the input signal;

adjusting the supply voltage of the amplifier to the determined supply voltage level at the same time the corresponding input signal is received at the input of the amplifier; and amplifying the input signal for producing a linear amplified output signal; and delaying the input signal prior to the input signal being received by the amplifier; wherein the amplifier comprises an LDMOS transistor having a drain connection and a gate connection; and further wherein a first DC blocking capacitor is coupled between the gate connection of the LDMOS and the input.

2. The method of claim 1, wherein the amplifier is an LDMOS transistor.

3. The method of claim 2, wherein the step of determining an appropriate supply voltage level includes determining a drain bias voltage level, and said step of adjusting the supply voltage of the amplifier includes adjusting the drain bias voltage level.

4. The method of claim 2, wherein the step of determining an appropriate supply voltage level includes determining a gate bias voltage level, and said step of adjusting the supply voltage of the amplifier includes adjusting the gate bias voltage level.

5. The method of claim 2, wherein the step of determining an appropriate supply voltage level includes determining both a drain bias voltage level and a gate bias voltage level, and said step of adjusting the supply voltage of the amplifier includes adjusting both the drain bias voltage level and the gate bias voltage level.

6. The method of claim 1, wherein the step of determining an appropriate supply voltage level includes determining an appropriate supply voltage level for maintaining a constant phase characteristic of −105°.

7. An apparatus for increasing the linearity of the phase and gain of an amplifier circuit comprising:

an input for receiving an input signal to be amplified;

an envelope detector coupled to said input for detecting the power level of the input signal;

a processing unit coupled to said envelope detector for determining a supply voltage level, based upon the power level of the input signal;

an amplifier coupled to said processing unit and said input for receiving an input signal, and producing a linear amplified output signal; wherein said processing unit adjusts the supply voltage level of said amplifier for maintaining the linearity of the amplified output signal;

an output for outputting said linear amplified output signal;

a delay circuit coupled between said amplifier and the input for delaying the input signal prior to the input signal being received by the amplifier; wherein said amplifier comprises an LDMOS transistor having a drain connection and a gate connection; and a first DC blocking capacitor coupled between said gate connection of said LDMOS and said input.

8. The apparatus of claim 7, wherein said delay circuit has a delay value corresponding to the time for said envelope detector to detect the power level of said input signal, and the time for said processing unit to determine the supply voltage level for maintaining the linearity of the amplified output signal and for adjusting the supply voltage level of the amplifier to the determined supply voltage level.

9. The apparatus of claim 8, wherein said supply voltage includes a gate bias voltage coupled to said gate connection of said LDMOS transistor.

10. The apparatus of claim 8, wherein said supply voltage includes a drain bias voltage coupled to said drain connection of said LDMOS transistor.

11. The apparatus of claim 8, further comprising a second DC blocking capacitor coupled between said drain connection of said LDMOS and said output.

12. The apparatus of claim 8, further comprising a first RF blocking circuit coupled between said processor unit and said gate connection of said LDMOS.

13. The apparatus of claim 8, further comprising a second RF blocking circuit coupled between said processor unit and said drain connection of said LDMOS.

* * * * *